United States Patent
Dupont et al.

(10) Patent No.: US 12,408,485 B2
(45) Date of Patent: Sep. 2, 2025

(54) OPTOELECTRONIC DEVICE WITH REFLECTOR

(71) Applicant: ALEDIA, Echirolles (FR)

(72) Inventors: Tiphaine Dupont, Grenoble (FR); Mehdi Daanoune, Renage (FR)

(73) Assignee: ALEDIA, Echirolles (FR)

( * ) Notice: Subject to any disclaimer, the term of this patent is extended or adjusted under 35 U.S.C. 154(b) by 0 days.

(21) Appl. No.: 18/879,459

(22) PCT Filed: Jun. 21, 2023

(86) PCT No.: PCT/EP2023/066847
§ 371 (c)(1),
(2) Date: Dec. 27, 2024

(87) PCT Pub. No.: WO2024/002833
PCT Pub. Date: Jan. 4, 2024

(65) Prior Publication Data
US 2025/0261481 A1   Aug. 14, 2025

(30) Foreign Application Priority Data
Jun. 30, 2022 (FR) .................................. 2206628

(51) Int. Cl.
*H10H 20/814* (2025.01)
*H10H 20/812* (2025.01)
*H10H 20/821* (2025.01)

(52) U.S. Cl.
CPC ...... *H10H 20/8142* (2025.01); *H10H 20/812* (2025.01); *H10H 20/821* (2025.01)

(58) Field of Classification Search
CPC . H10H 20/8142; H10H 20/821; H10H 20/812
See application file for complete search history.

(56) References Cited

U.S. PATENT DOCUMENTS

2015/0257234 A1* 9/2015 Wang ..................... H05B 33/10
                                                                            313/499
2018/0374988 A1* 12/2018 Mi ........................ H10H 20/821
(Continued)

FOREIGN PATENT DOCUMENTS

WO    2019243746 A1   12/2019
WO    2022129250 A1    6/2022

OTHER PUBLICATIONS

International Preliminary Report On Patentability (Chapter I) and Written Opinion of the International Searching Authority issued in PCT/EP2023/066847; issued Sep. 5, 2023.
(Continued)

*Primary Examiner* — Mark W Tornow
(74) *Attorney, Agent, or Firm* — Studebaker Brackett PLLC

(57) ABSTRACT

The invention relates to an optoelectronic device (1) comprising at least one first light source (100) configured to emit a first light beam (101) emitting at at least a first wavelength $\lambda_1$ and emitted in at least one direction referred to as the first emission direction (110), the device being characterized in that it furthermore comprises at least one first reflector (150) bordering the first light source, configured to reflect in a first direction of reflection of the light rays with the first wavelength $\lambda_1$ emitted in the first emission direction, and in that the at least one first reflector comprises a plurality of first passive nanowires (151).

20 Claims, 5 Drawing Sheets

(56) References Cited

U.S. PATENT DOCUMENTS

| | | | | |
|---|---|---|---|---|
| 2020/0185219 A1* | 6/2020 | Busani | ................ | H01L 21/0254 |
| 2020/0235253 A1* | 7/2020 | Xing | ..................... | H10F 77/331 |
| 2021/0066564 A1* | 3/2021 | Kanaya | ................ | H10H 20/856 |

OTHER PUBLICATIONS

International Search Report issued in PCT/EP2023/066847 mailed on Sep. 5, 2023.

* cited by examiner

OPTOELECTRONIC DEVICE WITH REFLECTOR

TECHNICAL FIELD OF THE INVENTION

The present invention relates in particular to the field of microelectronic and optoelectronic technologies. It finds a particularly advantageous but non-limitative application in display systems based on LEDs (light-emitting diodes).

PRIOR ART

A display screen generally comprises a plurality of pixels disposed on a so-called base plane and emitting independently of one another. Each color pixel generally comprises at least three components for emitting and/or converting a light flow, also referred to as subpixels. These subpixels each emit a light flow substantially in a single color (typically red, green and blue). The color of a pixel perceived by an observer comes from the superimposition of the various light flows emitted by the subpixels.

Typically, an LED or micro-LED makes it possible to emit the light flow associated with a subpixel. One important challenge of these technologies relates to the directivity of the light emitted by the LEDs. This is because, even if the LED is configured to emit mainly in a direction normal to the base plane, some rays of the beam are emitted in directions that are too raking to be extracted from the subpixel and do not participate in the light intensity perceived by the observer.

Numerous light-extraction solutions have been disclosed in the prior art. One of them relates to extracting a laser light by means of a textured surface. This solution is shown schematically in FIG. 1. A waveguide 30 in which a laser radiation 41 propagates consists firstly of a region 31 used as a DFB ("Distributed FeedBack") laser cavity. This region 31 is electrically injected—it is the active zone of the guide—and has a high coupling coefficient allowing propagation with few losses. The waveguide secondly consists of a region 32 enabling part of the laser radiation to be extracted on the surface 42. The region 32 is a passive zone of the guide, it is not electrically injected. It has a lower coupling coefficient than the active zone. The waveguide 30 is a simple layer structured as a periodic grating the height and pitch of which are configured to confine (at the active zone 31) or to extract (at the passive zone 32) the laser radiation 41. The laser radiation comes from a lateral region that is not shown on FIG. 1.

This solution is frequently used for laser extraction but is not compatible with non-coherent light sources such as LEDs. In addition, though this solution makes it possible to obtain good extraction efficiency, it is incompatible with light extraction taking place in the same region as the light emission, as is the case in display screens formed by pixels.

Another solution, this time adapted to pixels based on LEDs, consists in forming a composite mirror around each subpixel. However, forming such a mirror, at a very low height, requires masking and deposition steps that are complex to implement without degrading surrounding LEDs and without adding contaminations.

There is therefore a need for a light-extraction solution compatible with the structure of pixels based on LEDs, the implementation of which does not impair the quality of the pixels and which has better extraction performances than the current structures.

SUMMARY OF THE INVENTION

To achieve this objective, a first object relates to an optoelectronic device comprising a substrate having a top face extending on a so-called base plane defined by a first direction and a second direction, at least one first source of light disposed on the top face and configured to emit a first light beam emitting at least at a first wavelength $\lambda_1$, said first light beam being emitted at least in a direction called the first emission direction, a first emission direction vector of which has a non-zero component in at least one from the first direction and the second direction.

The device is characterized in that it furthermore comprises at least one first reflector at least partly bordering the first light source, configured to reflect, in a first reflection direction, first light rays with a first wavelength $\lambda_1$ emitted in the first emission direction, and in that the at least one first reflector comprises a plurality of first passive nanowires extending from the top face of the substrate.

The first reflector formed by first passive nanowires makes it possible to effectively reflect the first light rays and thus to extract the light emitted by the first light source.

A second object relates to a method for manufacturing an optoelectronic device comprising a first light source and a first reflector itself comprising a plurality of first passive nanowires. This method comprises the following steps:

Providing a substrate having a top face, extending in a plane referred to as a base plane defined by a first direction and a second direction and comprising a nucleation layer allowing the nucleation and growth of the first passive nanowires, Growing the first passive nanowires from the top face of the substrate so as to form the first reflector, the first reflector being configured to reflect, in a first reflection direction, first light rays with a first wavelength $\lambda_1$ emitted in the first emission direction, Forming the first light source on the top face of the substrate, the first light source being configured to emit a first light beam emitting at least at the first wavelength $\lambda_1$, said first light beam being emitted at least in a direction called the first emission direction, a first emission direction vector of which has a non-zero component in at least one from the first direction and the second direction.

According to one advantageous embodiment, the first light source comprises at least one first active nanowire the formation of which takes place simultaneously with the formation of the first passive nanowires. Forming the passive and active nanowires during the same manufacturing steps makes it possible to limit the degradation of the quality of the pixels. This solution is in particular made possible by the fact that the first active nanowires (forming the first light source) and the first passive nanowires (forming the first reflector) can be based on the same material. This was in particular not the case in the solution described consisting in depositing composite mirrors around subpixels.

BRIEF DESCRIPTION OF THE FIGURES

The goals, objects, features and advantages of the invention will be better understood from the detailed description of an embodiment of the latter that is illustrated by the following accompanying drawings in which.

Figure 1:
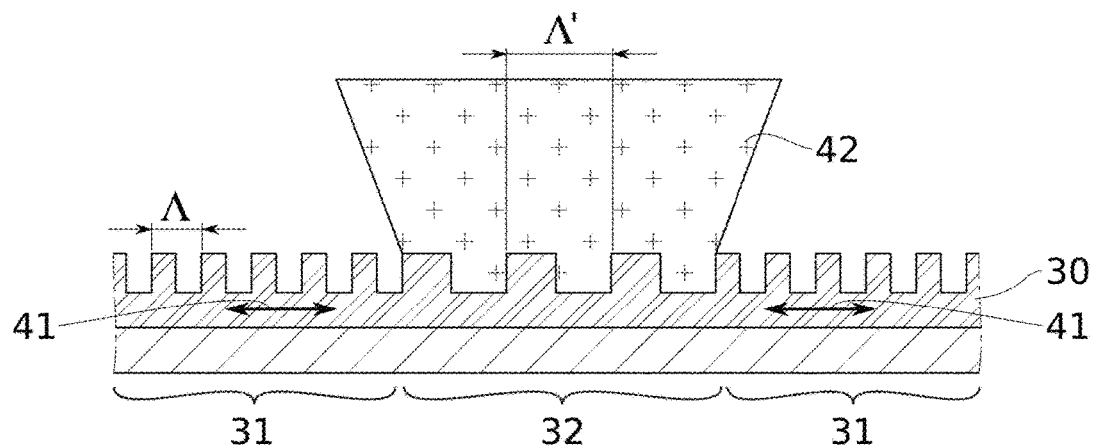
FIG. 1 shows a diffraction grating used in the prior art for a surface laser emission.
Figure 2A:
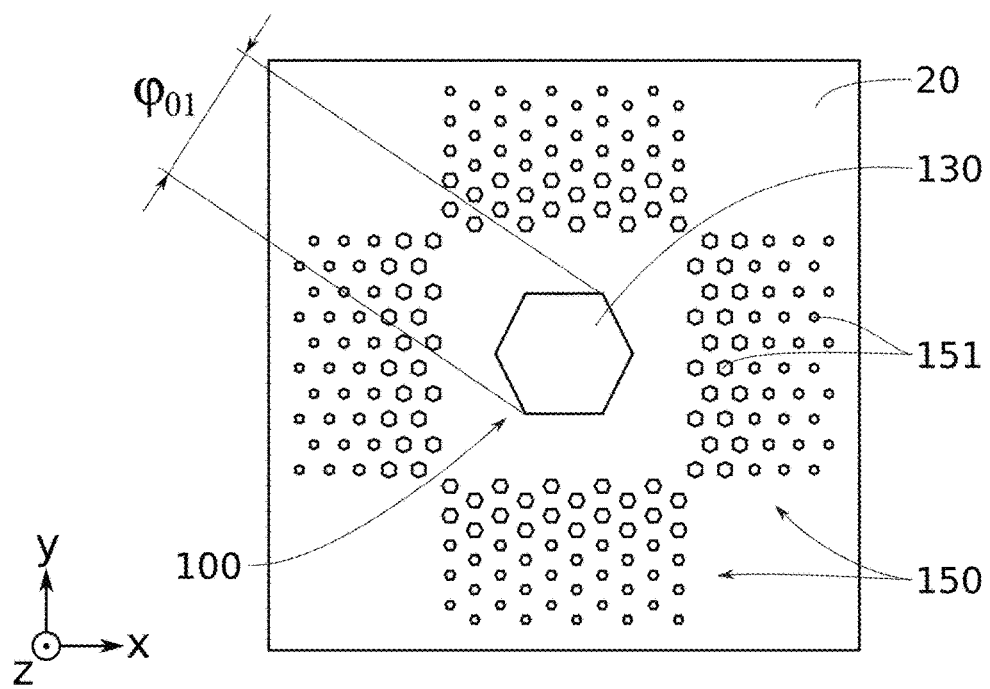
FIG. 2A shows a plan view of an embodiment of the device that is the object of the invention. A light source and a reflector surrounding it are in particular visible.
Figure 2B:
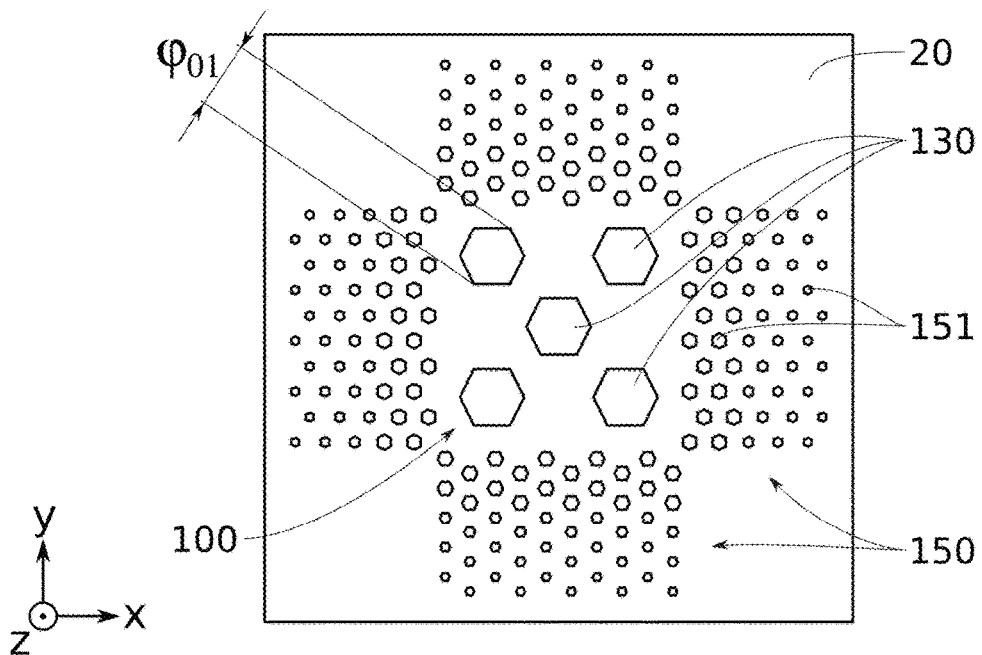
FIGS. 2B to 2E show plan views of other embodiments of the device that is the object of the invention. They illustrate different variants concerning the number and arrangement of nanowires that the light source of the device can comprise.
Figure 2C:
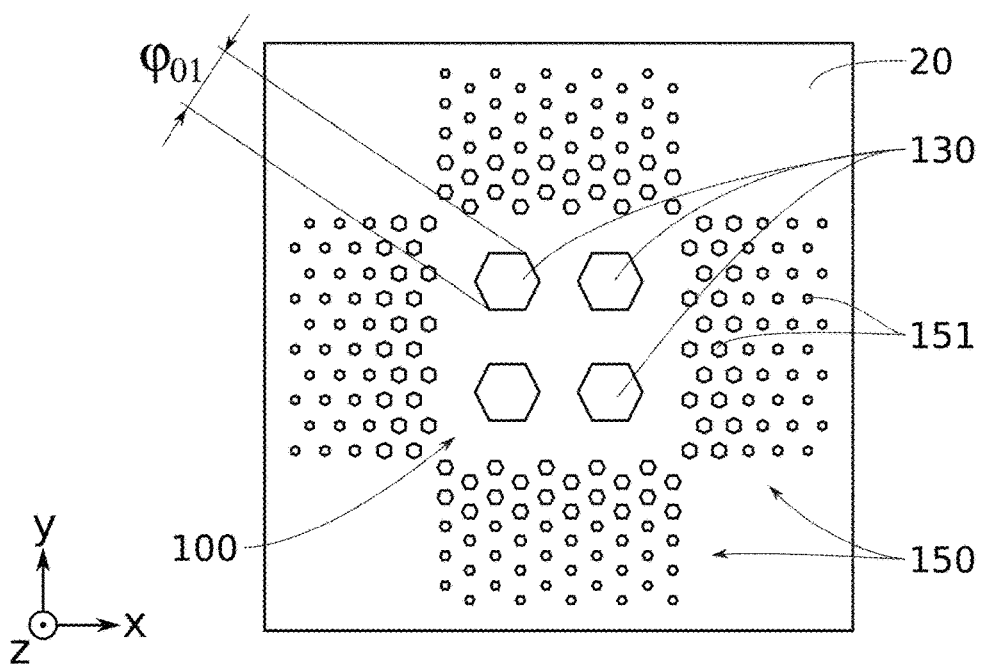
Figure 2D:
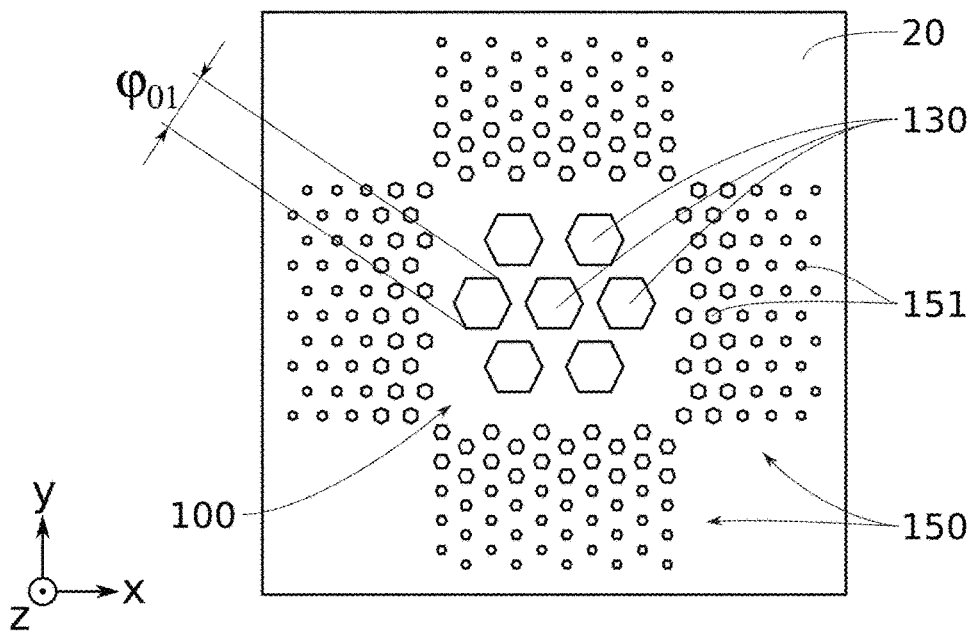
Figure 2E:
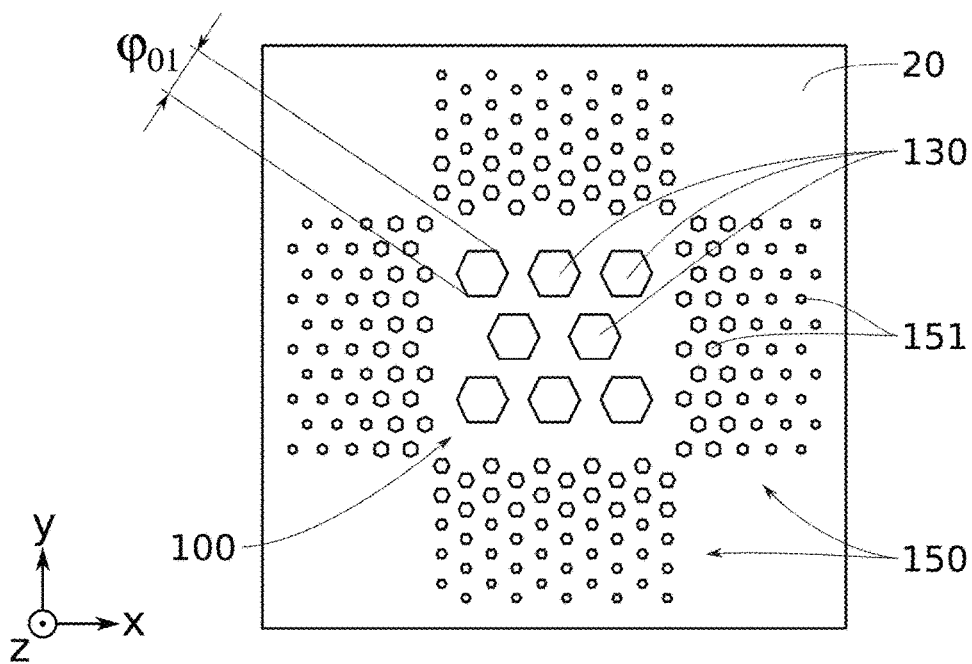
Figure 3:
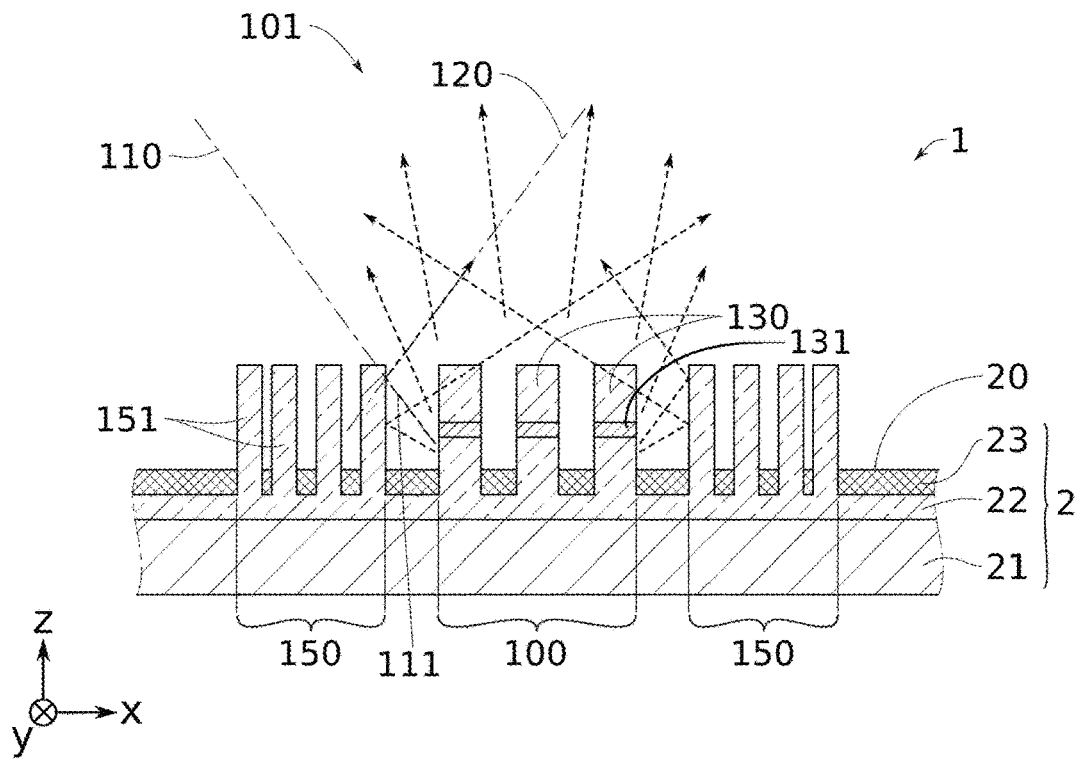
FIG. 3 shows a view in cross section of an embodiment of the device according to the invention comprising a single light source. A light source comprising active nanowires and emitting a light beam and a reflector comprising passive nanowires are in particular visible.
Figure 4:
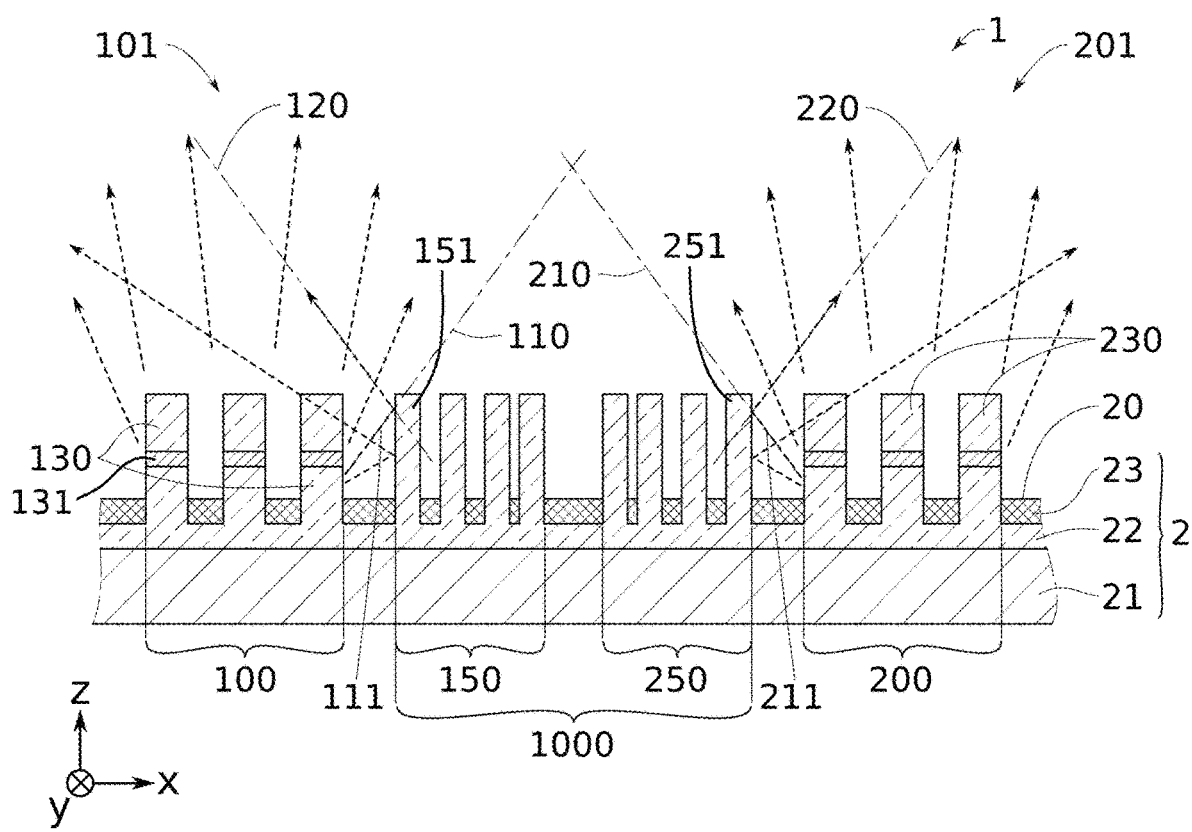
FIG. 4 shows a view in cross section of an embodiment of the device according to the invention comprising two adjacent light sources separated by a transition zone.

The drawings are given as examples and do not limit the invention. They constitute schematic outline representations intended to facilitate understanding of the invention and are not necessarily plotted to the scale of practical applications. In particular, the dimensions of each of the elements are not representative of reality.

DETAILED DESCRIPTION OF THE INVENTION

Before undertaking a detailed review of embodiments of the invention, optional features are listed below that can optionally be used in combination or alternatively:

According to one embodiment, the first light source is a non-coherent light source.

According to one embodiment, the first passive nanowires have a diameter decreasing or increasing gradually on going away from the at least one first light source. This makes it possible to avoid breaks in symmetry and edge effects around the first light source and therefore around the subpixel formed by the first light source.

According to one embodiment, the first passive nanowires are arranged at a first constant pitch $p_1$ in at least one from the first direction and the second direction.

According to one embodiment, the first passive nanowires are arranged at a pitch increasing or decreasing gradually on going away from the at least one first light source. This makes it possible to avoid breaks in symmetry and edge effects around the first light source and therefore around the subpixel formed by the first light source.

According to one embodiment, the at least one first light source comprises at least one first active nanowire having a first diameter $\varphi_{01}$ and comprising a first active region configured to emit the first light rays with the first wavelength $\lambda_1$.

According to one embodiment, the first diameter $\varphi_{01}$ of the at least one first active nanowire is less than 5 µm.

According to one example, the first passive nanowires and the at least one first active nanowire are based on the same material. In this embodiment, the first passive nanowires and the at least one first active nanowire can be formed by epitaxy in the same epitaxy reactor, which is advantageous in terms of simplicity of the method, costs and time.

According to another example, the first passive nanowires and the at least one first active nanowire are based on distinct materials. The first passive nanowires can then be formed by etching a material previously deposited alongside, or even all around, depending on the form required for the first reflector, the at least one first active nanowire.

According to one example, the reflector, and thus typically the first passive nanowires, and the light source are based on the same material.

According to one embodiment, the at least one first reflector entirely surrounds, in a projection onto the base plane, the first light source. This makes it possible to create a closed cavity around the first light source and to further improve the light extraction.

According to one embodiment:
  The first emission direction vector has a non-zero component in the first direction,
  The first emission direction vector has an orthogonal projection in a transverse plane defined by the first direction and a third direction normal to the base plane, referred to as the first emission projected vector $\vec{v}_{em,XZ}$, forming a first emission angle $\alpha_{em,XZ}$ with the third direction,
  A first reflection direction vector of the first reflection direction has an orthogonal projection in the transverse plane, referred to as the first reflection projected vector $\vec{v}_{em,XZ}$, forming a first reflection angle $\alpha_{ref,XZ}$ with the third direction,
  The plurality of passive nanowires are configured to reflect the first light rays so that the first emission angle $\alpha_{em,XZ}$ and the first reflection angle $\alpha_{ref,XZ}$ are distinct.

According to one example, the first reflection angle $\alpha_{ref,XZ}$ is less than 40°, preferably less than 20°.

According to one embodiment, the device furthermore comprises at least one second light source adjacent to the first light source, configured to emit a second light beam emitting at a second wavelength $\lambda_2$, said second light beam being emitted at least in a direction called the second emission direction, a second emission direction vector of which has a non-zero component in at least one from the first direction and the second direction, said first and second light sources being separated by a transition zone comprising the at least one first reflector and at least one second reflector, the at least one second reflector being configured to reflect, in a second reflection direction, second light rays with the second wavelength $\lambda_2$, said at least one second reflector comprising a plurality of second passive nanowires extending from the top face of the substrate.

According to one embodiment, the second light source is a non-coherent light source.

According to one embodiment, the second passive nanowires have a diameter decreasing or increasing gradually on going away from the at least one second light source.

According to one embodiment, the second passive nanowires are arranged at a second constant pitch $p_2$ in at least one from the first direction and the second direction.

According to one embodiment, the second passive nanowires are arranged at a pitch increasing or decreasing gradually on going away from the at least one second light source.

According to one embodiment, the at least one second light source comprises at least one second active nanowire having a second diameter $\varphi_{02}$ and comprising a second active region configured to emit the second light rays with the second wavelength $\lambda_2$.

According to one embodiment, the second diameter $\varphi_{02}$ of the at least one second active nanowire is less than 5 µm.

According to one embodiment of the method according to the invention:
  the first light source comprises at least one first active nanowire,
  the nucleation layer allows the nucleation and growth of the at least one active nanowire,
  the step of forming the first light source comprises a step of growing the at least one first active nanowire from the top face of the substrate so as to form the first light source.

According to one embodiment of the method according to the invention, the step of growing the first passive nanowires and the step of growing the at least one first active nanowire take place simultaneously.

Wire or nanowire means a 3D structure of elongate shape in the longitudinal direction. The longitudinal dimension of the 3D structure, along z in the figures, is greater, and preferably very much greater, than the transverse dimensions of the 3D structure, in the plane xy in the figures. For example, the longitudinal dimension is at least five times, and preferably at least ten times, greater than the transverse dimensions.

Diameter means the largest transverse dimension of the nanowire. In the present invention, the 3D structures do not necessarily have a circular cross-section. The 3D structures may in particular have a hexagonal or polygonal cross-section. In particular, in the case of 3D structures based on GaN, this cross-section may be hexagonal. The diameter then corresponds to a mean diameter calculated from the diameter of a circle inscribed in the polygon of the cross section and from the diameter of a circumscribed circle of this polygon.

In the context of the invention, the diameter of the nanowires is typically between 50 nm and 1.5 µm, preferably between 50 nm and 1 µm, preferably between 50 nm and 600 nm and advantageously substantially equal to 50 nm.

The longitudinal dimension, along z, of the nanowires is normally designated the height of the nanowires. In the context of the invention, the height of the nanowires is typically between 220 nm and 5 µm, preferably substantially equal to 260 nm.

In the present patent application, the terms "light-emitting diode", "LED" or simply "diode" are used as synonyms. An "LED" may also be understood as a "micro-LED".

Hereinafter, the following abbreviations relating to a material M are optionally used:

M-i refers to the intrinsic or not intentionally doped material M, according to the terminology normally used in the microelectronic field for the suffix -i.

M-n refers to the N, N+ or N++ doped material M, according to the terminology normally used in the microelectronic field for the suffix-n.

M-p refers to the P, P or P++ doped material M, according to the terminology normally used in the microelectronic field for the suffix -p.

A substrate, a layer or a device, "based on" a material M is taken to mean a substrate, a layer or a device comprising only this material M or this material M and possibly other materials, for example alloying elements, impurities or doping elements. Thus a 3D structure based on gallium nitride (GaN) can for example comprise gallium nitride (GaN or GaN-i) or doped gallium nitride (GaN-p, GaN-n). An active region based on gallium-indium nitride (InGaN) can for example comprise gallium-aluminum nitride (AlGaN) or gallium nitride with various proportions of aluminum and indium (GaInAlN). In the context of the present invention, the material M is generally crystalline.

A reference frame, preferably orthonormal, comprising the axes x, y, z is shown in the appended figures.

The terms "substantially", "about", "of the order of" mean, when they relate to a value, "to within 10%" of this value or, when they relate to an angular orientation, "to within 10°" of this orientation. Thus a direction substantially normal to a plane means a direction having an angle of 90±10° with respect to the plane.

To determine the geometry of the 3D structures and the compositions of the various elements (wire, active region, collar for example) of the 3D structures, scanning electron microscopy (SEM) or transmission electronic microscopy (TEM) or scanning transmission electron microscopy (STEM) analyses can be carried out.

TEM or STEM lend themselves particularly well to observing and identifying quantum wells—the thickness of which is generally of the order of a few nanometers—in the active region. Various techniques listed below non-exhaustively can be implemented: dark field and bright field imaging, weak beam imaging, high angle annular dark field imaging (HAADF).

The chemical compositions of the various elements can be determined by means of the well-known EDX or X-EDS method, which means "energy dispersive x-ray spectroscopy".

This method is well adapted to analyzing the composition of optoelectronic devices of small sizes such as LEDs based on nanowires (3D LEDs). It can be implemented on metallurgical sections in a scanning electron microscope (SEM) or on thin plates in a transmission electron microscope (TEM).

The optical properties of the various elements, and in particular the main emission wavelengths of 3D LEDs based on GaN and/or active regions based on InGaN, can be determined by spectroscopy.

Cathodoluminescence (CL) and photoluminescence (PL) spectroscopies are well adapted to optically characterizing the 3D structures described in the present invention.

The techniques mentioned above make it possible in particular to determine whether an LED optoelectronic device comprises one or more lateral reflectors formed by nanowires, according to a principle of the present invention.

The optoelectronic device 1 that is the object of the invention comprises a substrate 2 having a top face 20 extending along a plane defined by a first direction and a second direction. These two directions correspond in FIGS. 2A to 2E, 3 and 4 to the directions carried by the axes x and y of the orthogonal reference frame shown. The substrate 2 can be in the form of a stack comprising, in the direction z, a support 21, a surface layer referred to as a nucleation layer 22, and a masking layer 23.

In particular, the substrate 21 may be made of sapphire to limit the mesh parameter discrepancy with GaN, or of silicon to reduce costs and for technological compatibility problems. In the latter case, it may be in the form of a wafer with a diameter of 200 mm or 300 mm. In particular, it serves as a support to the 3D structures.

The nucleation layer 22 can be based on AlN. Alternatively, it may be based on other metal nitrides, for example GaN or AlGaN. It can be formed on the silicon support 21 by epitaxy, preferably by MOVPE (the acronym of MetalOrganic Vapor Phase Epitaxy). According to one example, the nucleation layer 22 has a thickness of between 1 nm and 10 µm (1 nm=$10^{-9}$ m). It preferably has a thickness of the order of a few hundreds of nanometers, for example approximately 100 nm or 200 nm, to a few microns, for example of the order of 2 µm. It can also have a thickness of less than 100 nm. This makes it possible to limit the mechanical stresses caused by this layer 22 on the support 21. This avoids a detrimental curvature of the substrate 21. Such a thickness furthermore limits the apparition of structural defects in the nucleation layer 22. In particular, the growth of this nucleation layer 22 may be pseudomorphic, i.e. the epitaxy stresses (related in particular to the difference in mesh parameters between Si and AlN, GaN or AlGaN) may be elastically relieved during the growth. Thus the crystalline quality of this nucleation layer 22 may be optimized.

The optoelectronic device 1 also comprises a first light source 100 disposed on the top face 20 of the substrate 2. This first light source 100 typically comprises at least one active nanowire 130, as shown on FIG. 2A. Such a nanowire 130 advantageously extends from the optional nucleation layer 22 and through an opening in the optional masking layer 23 of the substrate 2. The first light source 100 advantageously comprises a plurality of first active nanowires 130, as shown on FIGS. 2B to 2E.

The first active nanowires 130 can be arranged in various configurations, some of which are illustrated in FIGS. 2B to 2E. The arrangement of the first active nanowires 130 advantageously has at least one symmetry plane other than a symmetry plane parallel to the base plane. It is preferentially configured so that the electromagnetic field in the first light source has maximums at the active nanowires.

An active nanowire 130 comprises an active region 131 and is electrically connected. This active region 131 is the site of radiative recombinations of electron-hole pairs making it possible to obtain light radiation having a principal wavelength. The active region 131 typically comprises a plurality of quantum wells, for example formed by emissive layers based on GaN, InN, InGaN, AlGaN, AlN, AlInGaN, GaP, AlGaP, AlInGap, AlGaAs, GaAs, InGaAs, or AlIIAs, or a combination of several of these materials.

The first light source 100 typically comprises a layer based on a transparent conductive oxide, normally referred to as TCO ("Transparent Conductive Oxide"), the thickness of which is preferably between 100 and 300 nm. The nanowires are typically disposed in the longitudinal direction between a mirror layer based on a metal material, typically Al, and the TCO layer. This arrangement of the nanowires between the mirror layer and the TCO layer optionally makes it possible to create a Fabry-Perot cavity in the longitudinal direction.

The first light source 100 is advantageously sized to have dimensions of the order of those of a subpixel of a display device, preferentially between 1 µm and 150 µm, typically between 4 and 150 µm.

The first light source 100 is configured to emit a first light beam 101. Advantageously, the first light beam 101 is configured to be emitted mainly in a direction normal to the substrate 2, i.e. extending parallel to the axis z shown on FIGS. 2A to 4, referred to as the longitudinal direction. The light beam 101 comprises however a multitude of rays propagating in so many emission directions. The emission is for example omnidirectional. The rays of the beam are typically emitted in a Lambertian or orthotopic profile, i.e. the luminance of the light source 100 is uniform angularly, but the light intensity emitted depends on the emission direction. The light intensity of the beam typically varies according to Lambert's law:

$$I = I_0 \cos(\theta)$$

with I the light intensity in an emission direction, $I_0$ the light intensity at the source and e the angle of the emission direction with respect to the normal to the source surface, here the longitudinal direction. Naturally any other emission profile can be envisaged and the first light source 100 is not limited to a Lambertian source.

Whatever the emission profile of the first light source 100, the first light beam 101 is such that it emits at least one first light ray 111 with a wavelength $\lambda_1$ referred to as the first wavelength $\lambda_1$ in a first emission direction 110. In practice, the first light beam 101 typically emits a plurality of rays the wavelengths of which form a continuum. The first emission direction 110 is characterized by the fact that every direction vector of this first transmission direction 110 has a non-zero component in the first direction x and/or the second direction y. In other words, the first emission direction 110 is not parallel to the longitudinal direction.

As mentioned in the introduction, one objective of the present application is to redirect the light rays deviating from the longitudinal direction so that they participate in the light intensity perceived by the user.

The present invention therefore provides for the presence of at least one first reflector 150 disposed on the top face 20 of the substrate 2 and at least partly bordering the first light source 100. The first reflector 150 is configured to reflect the first light ray 111 propagating in the first emission direction 110. The first light ray 111 is reflected in a first reflection direction 120 every direction vector of which has a non-zero component in the first direction x and/or the second direction y. Depending on the presence or not of other reflectors around the light source 100, on the extent of the first reflector 150 around the first light source 100 and on the height of the at least one first reflector 150, the first light ray 111 can then be sent in the direction of the other wall of the reflector 150 or a wall of another reflector and once again be reflected, or no longer be reflected, by the device 1. Thus, advantageously, and optionally after several reflections against the first reflector 150 and/or other reflectors, the first light ray 111 is extracted from the device 1 and participates in the total intensity perceived by the observer.

According to one embodiment, the first reflector 150 operates as a mirror, i.e. the first emission direction 110 and the first reflection direction 120 are symmetrical with respect to a plane normal to a plane of the first reflector 150. This plane of the first reflector 150 can be defined in several ways and can in particular be defined locally. For example, if the passive nanowires 151 of the first reflector 150 are arranged in rectilinear rows, the plane of the first reflector 150 is defined as the plane comprising the symmetry axes along z of the passive nanowires 151 in the row of passive nanowires 151 bordering the first light source 100. If the first passive nanowires 151 of the first reflector 150 are arranged in rows forming arcs of a circle, it is possible to define, at the point of incidence of the first light ray 111 with the first reflector 150, the plane of the first reflector 150 as the plane tangent to the arc of a circle defined by the row of first passive nanowires 151 bordering the first light source 100.

Figure 5:
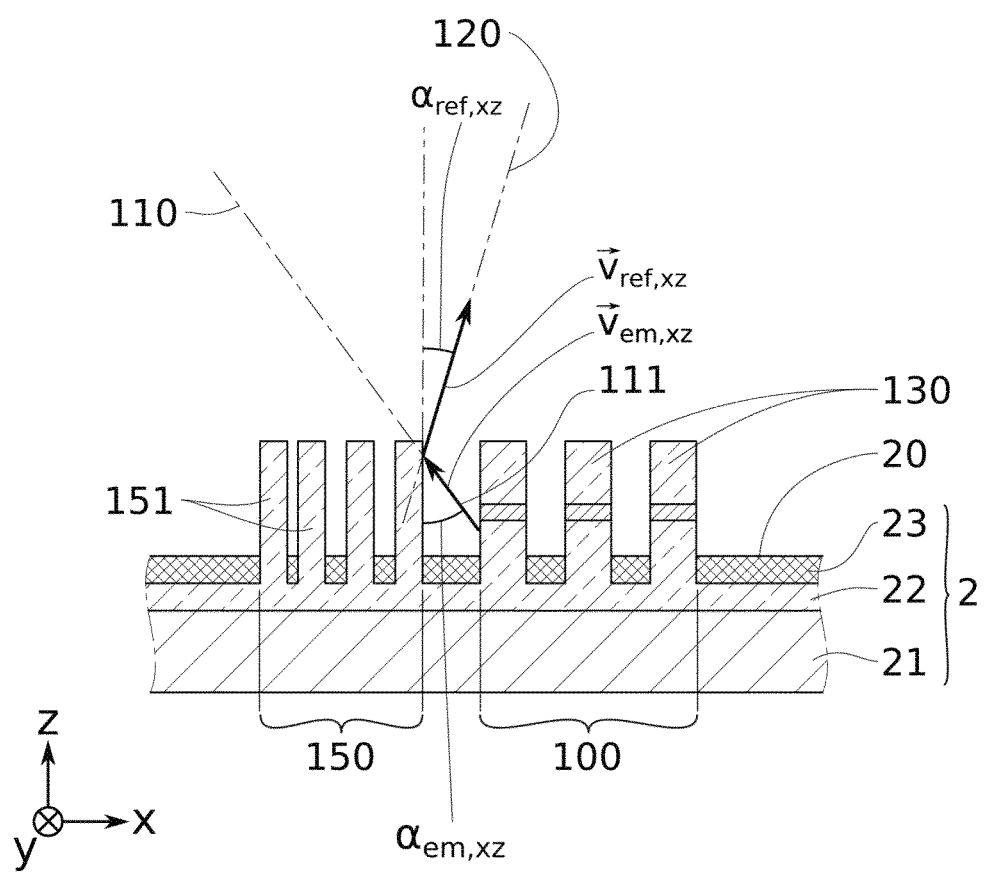
FIG. 5 shows a view in cross section of an embodiment wherein the reflector has a decoupler function.

According to another embodiment, the first reflector 150 operates not as a mirror but as a decoupler. In this example, the first light ray 111 is not reflected symmetrically by the first reflector 150. This embodiment is illustrated in FIG. 5. In this figure a case is more particularly envisaged in which the first passive nanowires 151 are disposed in parallel rectilinear rows oriented in the direction y. FIG. 5 is a view in cross section along the plane xz of the reflection of the first light ray 111 by the first reflector 150. The first light ray 111 propagates in a first emission direction 110 that can be defined by a first emission direction vector. This first emission direction vector allows, in the plane xz, an orthogonal projection denoted $\vec{v}_{em,xz}$. In the same manner, after reflection, the first light ray 111 propagates in a first reflection direction 120 that can be defined by a first reflection direction vector allowing, in the plane xz, an orthogonal projection denoted $\vec{v}_{ref,xz}$. These two orthogonal projections form respectively a first emission angle $\alpha_{em,xz}$ and a first reflection angle dref xz with the direction z. In the previously described case of a first reflector 150 acting as a mirror, these angles are equal. On the other hand, in a decoupling function, the first reflector makes it possible to divert the first light ray so that $\alpha_{em,XZ} \neq \alpha_{ref,XZ}$. For the purpose of optimizing the light extraction, the first reflector 150 is configured so that the first reflection direction is close to the direction z. Thus the first reflection angle is preferably less than 20°, and even more advantageously less than 10°.

This same decoupling phenomenon can be provided in the plane yz.

As mentioned previously, the first light source 100 typically emits a plurality of light beams corresponding to a continuum of wavelengths. Thus the first reflector 150 is advantageously configured to reflect a plurality of wavelengths. Typically, it makes it possible to reflect all the wavelengths lying in a given range. For example, if the first light source 100 forms part of a blue-colored subpixel, the first reflector 150 can be configured to reflect the wavelengths between 430 nm and 470 nm. So that the first reflector 150 reflects a plurality of wavelengths, provision is advantageously made for the diameter of the first passive nanowires 151 and the pitch between adjacent first passive nanowires 151 to change with the distance to the first light source 100.

Advantageously, the first reflector 150 is disposed on the substrate 2 so as to completely surround the first light source 100 in the plane xy. This embodiment illustrated in FIGS. 2A to 2E makes it possible to reflect a larger number of light rays which, without the presence of reflector, would not have been extracted from the device 1, and therefore further improves the directivity of the first light beam 101. Preferentially, by completely surrounding the first light source 100, the at least one first reflector 150 forms a rectangular-shaped cavity around the first light source 100. Such a cavity is similar to the association of two cavities of the Fabry-Perot type disposed in orthogonal directions. This cavity advantageously has a width W of less than 1 µm (1 µm=$10^{-6}$ m).

The first reflector 150 advantageously includes a plurality of first passive nanowires 151 extending from the top face 20 of the substrate 2. "Passive nanowire" means a nanowire not emitting any light radiation. The passive nanowires 151 are typically nanowires similar to active nanowires but are not electrically connected. The first passive nanowires 151 can in particular be electrically insulated from the first active nanowires 130, which can form the first light source 100. Thus the first active nanowires 130 can have a current passing through them and can generate a light beam without the passive nanowires 151 themselves being electrically connected.

The first passive nanowires 151 preferably form a photonic crystal extending over the substrate 2, for example a Bragg mirror. The photonic crystal formed by all the first passive nanowires 151 of the first reflector 150 can be described by several parameters and in particular:
- the grating pitch,
- the filling ratio, also referred to as the opening ratio or density, generally between 10 and 90%,
- the mesh type (hexagonal, square, etc.),
- the refractive index of any filling material between the nanowires, normally referred to as a "filler", preferentially between 1 and 1.7, and
- the dimensions of the nanowires.

In the case where the first reflector is used as a mirror, the characteristics of the first photonic-crystal reflector 150 are defined so that the spectral stopband of the first photonic-crystal reflector 150 comprises the first wavelength $\lambda_1$. The pitch and the diameter of the first passive nanowires 151 of the first reflector 150 must in particular be adjusted according to the first wavelength $\lambda_1$.

In the case where the first reflector is used as a decoupler, these characteristics are adjusted according to the reflection angles that it is wished to impose. More precisely, these characteristics are defined so that the optical modes supported by the photonic crystal of the first reflector 150 at the first wavelength M are located above the light cone defined by the following equation:

$$\beta_{air} = \frac{\omega}{c} \text{ with } \beta_{air}$$

the propagation constant of the light beam in air, $\omega$ the angular frequency of the incident light beam and c the velocity of light. If an incident light beam has an orientation located outside the extraction cone, it will be entirely reflected and there will be no refracted ray (total-reflection phenomenon).

To avoid a total reflection phenomenon, the top of the nanowires can be covered by a layer giving rise to a certain topography and therefore an associated diffusion phenomenon. This layer is said to be a diffusive layer. It makes it possible to avoid or limit the total-reflection phenomenon. The incident light beam can thus be reflected and then diffused or refracted. For small angles of incidence, successive reflections of the incident beam between the mirrors can occur before diffusion or reflection. Extraction of the beams with low incidences is thus improved. The diffusive layer can typically be based on $TiO_2$. According to one possibility, the topography of the tops, for example having a pyramid shape, acts as such a diffusive layer and improves the light extraction.

The various wires (first active nanowires 130, first passive nanowires 151) are preferably formed through a masking layer 23 partly masking the nucleation layer 22 and comprising preferably circular openings defined so as to obtain the various wire diameters and the various required arrangements or gratings. Each opening in the masking layer 23 in fact allows localized growth of a 3D structure from the nucleation layer 22.

Preferably, the masking layer 23 is made of a dielectric material, for example of silicon nitride $Si_3N_4$. It can be deposited by chemical vapor deposition CVD on the nucleation layer 22. For example, the openings may be made by UV or DUV (the acronym of Deep UV) lithography, by electron beam lithography, or by NIL (the acronym of NanoInprint Lithography). It can be removed after growth of the various wires, for example by selective etching.

The device described makes it possible to obtain a cavity effect even for subpixels with very small dimensions. This effect is in fact obtained for cavity width a small as 1 µm.

The device advantageously makes it possible to decorrelate the characteristics particular to the source, such as the emission wavelength, characteristics particular to the extraction or to the shaping of the light emitted by this source. By using different nanowires for the source and the reflectors, it is thus possible to form an emissive part and a resonant cavity that are substantially independent. The combinations that can be envisaged between the source and the reflectors are thus more numerous. This makes it possible to envisage a large number of technological configurations, depending on the applications sought.

According to one advantageous embodiment, the optoelectronic device 1 comprises a second light source 200 disposed on the top face of the substrate and adjacent to the first light source 100. The two light sources 100, 200 can be assimilated to two adjacent subpixels of a display screen. It can be a case of two subpixels belonging to one and the same pixel or two subpixels each belonging to a distinct pixel.

The second light source 200 is configured to emit a second light beam 201 being, like the first light beam 101, advantageously configured to be mainly emitted in the longitudinal direction. The second light beam 201 is for example omnidirectional and typically has a Lambertian profile. The second light beam 201 emits at least one second light ray 211 with a wavelength $\lambda_2$ referred to as the second wavelength $\lambda_2$ in a second emission direction 210. This second emission direction 210 is characterized by the fact that every direction vector of this second transmission direction 210 has a non-zero component in the first direction x and/or the second direction y.

The second light source 200 preferentially comprises at least one second active nanowire 230 extending from the top face 20 of the substrate 2. It is bordered by a second reflector 250 advantageously comprising a plurality of second passive nanowires 251 extending from the top face 20 of the substrate 2. The second passive nanowires form a photonic crystal that can be described in the same way as the photonic crystal formed by the first passive nanowires 151.

The second active nanowires 230 and the second passive nanowires 251 are preferably also formed through openings in the optional masking layer 23, as described for the first active nanowires 130 and the first passive nanowires 151.

The second reflector 250 is configured to reflect the second light ray 211 propagating in the second emission direction 210. The second light ray 211 is reflected in a second reflection direction 220 every direction vector of which has a non-zero component in the first direction x and/or the second direction y. As described for the device with a single light source, the second light ray 211 is thus extracted from the device 1 and participates in the total intensity perceived by the observer.

The characteristics of the first photonic-crystal reflector 150 are adapted mutatis mutandis to the second photonic-crystal reflector 250. In particular, if the second reflector 250 is used as a mirror, they are defined so that the spectral stopband of the second photonic-crystal reflector 250 comprises the second wavelength $\lambda_2$. The pitch and the diameter of the second passive nanowires 251 of the second reflector 250 must in particular be adjusted according to the second wavelength $\lambda_2$.

In the same way as the first reflector 150, the first reflector can be configured to be used as a decoupler.

The first light source 100 and the second light source 200 are separated by a transition zone comprising the first reflector 150 and the second reflector 250. This transition zone thus make it possible to isolate the first light source 100 from the rays emitted by the second light source 200, and vice versa.

The first passive nanowires 151 and/or the second passive nanowires 251 can advantageously have a diameter and/or a pitch between nanowires 151, 251 that increases or decreases gradually on moving away from the first light source and/or from the second light source respectively. Gradual variation of the diameter of the nanowires 151, 251 or of the pitch between these nanowires 151, 251 means, depending on the arrangement of the nanowires 151, 251 in the plane xy, that these parameters vary in proportions bounded between adjacent nanowires. Typically provision is made for the nanowires 151, 251 to have a diameter of between 3% and 13% of the diameter of their closest neighbor. In the case where the nanowires 151, 251 are disposed in parallel rows, provision is typically made for the pitch between one row and one of the two rows adjacent to it to be between 2% and 4% of the pitch separating this same row and the other one of the two rows adjacent to it.

It can be envisaged ensuring that the first reflector 150 and the second reflector 250 cover separate zones within the transition zone. In this case, provision is advantageously made for these separate zones to be adjacent and for the first passive nanowires 151 of the first reflector 150 bordering the second reflector and the second passive nanowires 251 of the second reflector 250 bordering the first reflector 150 to have substantially equal diameters.

It can also be envisaged for part of the first reflector 150 to coincide with a part of the second reflector 250.

The at least one first light source 100 can also be a so-called bidirectional light source (embodiment not illustrated) with an electroluminescent zone of the planar type emitting the first light rays with a first wavelength M in the first emission direction 110, as described previously. In a known manner, for example, the light source 100 comprises at least one stack of semiconductor layers and a covering layer, the covering layer comprising one or more radiation-emitting layers equivalent to the first active region 131. The various layers are superimposed and structured, and are substantially planar. The stack extends from the top face 20 of the substrate 2 so as to form, in a known manner, a luminescent mesa. In this embodiment, the stack of layers for forming the first light source 100 and the first passive nanowires 151 as described previously for forming the first reflector 150 can be formed successively in the same epitaxy reactor or according to known separate methods. They can be based on the same material or based on different materials. The first passive nanowires 151 can also be formed by etching a material previously deposited alongside the at least one first light source 100, or even all around, according to the form required for the first reflector at 150. The stack of semiconductor layers and covering layer can for example have a height taken along z of between 1 and 3 µm. The emitting layer or layers, corresponding to the first active region 131, advantageously have a height along z of between 200 and 1000 nm.

The features of this embodiment described with reference to the first light source 100 can apply mutatis mutandis to other light sources, in particular the second light source 200.

As illustrated through the previous examples, the devices according to the invention make it possible to improve the directivity of the beam emitted by a light source of the LED type, and therefore to improve the light extraction.

However, the invention is however not limited to the previously-described embodiments.

In particular, the number, the shape and the arrangement of each element of the device may be adapted according to the display requirements.

The invention claimed is:
1. An optoelectronic device comprising:
a substrate having a top face extending along a base plane defined by a first direction and a second direction,
at least one first light source disposed on the top face and configured to emit a first light beam emitting at least at a first wavelength $\lambda_1$, said first light beam being emitted at least in a direction called a first emission direction, a first emission direction vector of which has a non-zero component in at least one from the first direction or the second direction,
at least one first reflector at least partly bordering the first light source, configured to reflect, in a first reflection direction, first light rays with the first wavelength $\lambda_1$ emitted in the first emission direction, and the at least one first reflector comprises a plurality of first passive nanowires extending from the top face of the substrate, wherein the at least one first light source (100) comprises at least one first active nanowire (130) having a first diameter $\varphi_{01}$ and comprising a first active region (131) configured to emit the first light rays (111) with the first wavelength $\lambda_1$.

2. The optoelectronic device according to claim 1, wherein the first light source is a non-coherent light source.

3. The optoelectronic device according to claim 1, wherein the first passive nanowires have a diameter decreasing or increasing gradually on going away from the at least one first light source.

4. The optoelectronic device according to claim 1, wherein the first passive nanowires are arranged at a first constant pitch $p_1$ in at least one from the first direction or the second direction.

5. The optoelectronic device according to claim 1, wherein the first passive nanowires are arranged in a pitch increasing or decreasing gradually on going away from the at least one first light source.

6. The optoelectronic device according to claim 1, wherein the first diameter $\varphi_{01}$ of the at least one first active nanowire is less than 5 μm.

7. The optoelectronic device according to claim 1, wherein the first passive nanowires and the at least one first active nanowire are based on a same material.

8. The optoelectronic device according to claim 1, wherein the at least one first reflector entirely surrounds, in a projection onto the base plane, the first light source.

9. The optoelectronic device according to claim 1, wherein

The first emission direction vector has a non-zero component in the first direction, The first emission direction vector has an orthogonal projection in a transverse plane defined by the first direction and a third direction normal to the base plane, referred to as the first emission projected vector $\vec{v}_{em,XZ}$, forming a first emission angle $\alpha_{em,XZ}$ with the third direction, A first reflection direction vector of the first reflection direction has an orthogonal projection in the transverse plane, referred to as the first reflection projected vector $\vec{v}_{ref,XZ}$, forming a first reflection angle $\alpha_{ref,XZ}$ with the third direction, and The plurality of passive nanowires are configured to reflect the first light rays so that the first emission angle $\alpha_{em,XZ}$ and the first reflection angle $\alpha_{ref,XZ}$ are distinct.

10. The optoelectronic device according to claim 9, wherein the first reflection angle $\alpha_{ref,XZ}$ is less than 40°.

11. The optoelectronic device according to claim 1, furthermore comprising at least one second light source adjacent to the first light source, configured to emit a second light beam emitting at a second wavelength $\lambda_2$, said second light beam being emitted at least in a direction called the second emission direction, a second emission direction vector of which has a non-zero component in at least one from the first direction or the second direction, said first and second light sources being separated by a transition zone comprising the at least one first reflector and at least one second reflector, the at least one second reflector being configured to reflect, in a second reflection direction, second light rays with the second wavelength $\lambda_2$, said at least one second reflector comprising a plurality of second passive nanowires extending from the top face of the substrate.

12. The optoelectronic device according to claim 11, wherein the second light source is a non-coherent light source.

13. The optoelectronic device according to claim 12, wherein the second passive nanowires have a diameter decreasing or increasing gradually on going away from the at least one second light source.

14. The optoelectronic device according to claim 13, wherein the second passive nanowires are arranged at a second constant pitch $p_2$ in at least one from the first direction or the second direction.

15. The optoelectronic device according to claim 11, wherein the second passive nanowires are arranged in a pitch increasing or decreasing gradually on going away from the at least one second light source.

16. The optoelectronic device according to claim 11, wherein the at least one second light source comprises at least one second active nanowire having a second diameter $\varphi_{02}$ and comprising a second active region configured to emit the second light rays with the second wavelength $\lambda_2$.

17. The optoelectronic device according to claim 16, wherein the second diameter $\varphi_{02}$ of the at least one second active nanowire is less than 5 μm.

18. A method for manufacturing an optoelectronic device comprising a first light source and a first reflector comprising a plurality of first passive nanowires, comprising the following steps:

Providing a substrate having a top face, extending in a plane referred to as a base plane defined by a first direction and a second direction and comprising a nucleation layer allowing the nucleation and growth of the first passive nanowires, Growing the first passive nanowires from the top face of the substrate so as to form the first reflector, the first reflector being configured to reflect, in a first reflection direction, first light rays with a first wavelength $\lambda_1$ emitted in a first emission direction, and Forming the first light source on the top face of the substrate, the first light source being configured to emit a first light beam emitting at least at the first wavelength $\lambda_1$, said first light beam being emitted at least in a direction called the first emission direction, a first emission direction vector of which has a non-zero component in at least one from the first direction or the second direction.

19. The manufacturing method according to claim 18, wherein the first light source comprises at least one first active nanowire, the nucleation layer allows the nucleation and growth of the at least one active nanowire, and the step of forming the first light source comprises a step of growing the at least one first active nanowire from the top face of the substrate so as to form the first light source.

20. The manufacturing method according to claim 19, wherein the step of growing the first passive nanowires and the step of growing the at least one first active nanowire take place simultaneously.

* * * * *